(12) United States Patent
Nakamura et al.

(10) Patent No.: US 6,821,808 B2
(45) Date of Patent: Nov. 23, 2004

(54) CMOS APS WITH STACKED AVALANCHE MULTIPLICATION LAYER WHICH PROVIDES LINEAR AND LOGARITHMIC PHOTO-CONVERSION CHARACTERISTICS

(75) Inventors: Junichi Nakamura, Tokyo (JP); Isao Takayanagi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 271 days.

(21) Appl. No.: 10/226,326

(22) Filed: Aug. 23, 2002

(65) Prior Publication Data

US 2004/0046101 A1 Mar. 11, 2004

(51) Int. Cl.[7] .......................... H01L 21/00; H01L 29/04; H01L 21/036; H01L 31/20; G01T 1/24
(52) U.S. Cl. ...................... 438/57; 257/53; 250/370.08
(58) Field of Search .............................. 438/57, 59, 61, 438/63, 67; 257/53, 80; 250/370.08, 370.01

(56) References Cited

U.S. PATENT DOCUMENTS

| | | | |
|---|---|---|---|
| 5,818,052 A | 10/1998 | Elabd | |
| 2001/0045535 A1 | 10/2001 | Yasuda | |
| 2002/0180721 A1 * | 12/2002 | Kimura et al. | ............. 345/211 |

OTHER PUBLICATIONS

Klaas Bult, "Analog Broadband Communication Circuits in Pure Digital Deep Sub–Micron CMOS," ISSCC Dig. Tech. Papers, pp. 76–77, Feb. 1999.

Zhong–Shou Huang and Takao Ando, "A Novel Amplified Image Sensor with a–Si:H Photoconductor and MOS Transistors," IEEE Transaction on Electron Devices, vol. 37, No. 6, Jun. 1990, pp. 1432–1438.

Isao Takayanagi et al., "Amplified MOS Imager for Soft X–ray Imaging," IEEE Transactions on Electron Devices, vol. 42, No. 8, Aug. 1995, pp. 1425–1431.

Hon–Sum Wong, "Technology and Device Scaling Considerations for CMOS Imagers," IEEE Transactions on Electron Devices, vol. 43, No. 12, Dec. 1996, pp. 2131–2142.

Wug–Dong Park et al., "An a–Se HARP Layer for a Solid–state Image Sensor," IEEE Workshop on Charge–Coupled Device and Advanced Image Sensors, Jun. 1999, pp. 56–59.

Isao Takayanagi et al., "A Stacked CMOS APS for Charge Particle Detection and its Noise Performance," IEEE Workshop on Charge–Coupled Devices and Advanced Image Sensors, Jun. 1999, pp. 159–162.

Toshihasa Watabe et al., "CMOS Image Sensor overlaid with a HARP Photoconversion Layer," Program of 1999 IEEE Workshop on Charge–Coupled Devices and Advanced Image Sensors, pp. 211–214.

* cited by examiner

*Primary Examiner*—Craig A. Thompson
(74) *Attorney, Agent, or Firm*—Dickstein Shapiro Morin & Oshinsky LLP (57) ABSTRACT

The present invention provides a pixel which utilizes a charge multiplying photoconversion element. An output control circuit contains an operational amplifier that serves to fix the voltage level at the storage node to thereby maintain a constant effective operating potential across the charge multiplying photoconversion layer. The detected light signal may be converted to provide linear, logarithmic, and linear-logarithmic output signals.

48 Claims, 6 Drawing Sheets

CMOS APS WITH STACKED AVALANCHE MULTIPLICATION LAYER WHICH PROVIDES LINEAR AND LOGARITHMIC PHOTO-CONVERSION CHARACTERISTICS

FIELD OF THE INVENTION

The present invention relates to image sensors that use charge multiplying photoconversion layers to amplify the intensity of light captured by a pixel readout circuit.

BACKGROUND OF THE INVENTION

Amid the rising popularity for digital image devices such as digital cameras is a demand for increasingly higher picture resolution and for the devices to be more compact. Due to the interior space constraints in the compact housings, it is necessary to reduce the sizes of the electronic circuits in the device, including the image sensor. However, in reducing the size of the image sensor, a tradeoff exists between resolution and the signal levels outputted from the image sensor. If the resolution is kept the same upon reducing the size of the image sensor, the size of each pixel must be proportionately reduced. However, smaller pixels result in less light being collected by each pixel during image exposure, which in turn reduces the sensitivity of the image sensor. Although the reduced sensitivity effect can be offset by increasing the integration (exposure) time, this is an undesirable "solution" because increasing integration time also increases the potential for obtaining a blurred image if there is any movement by the image subject or the device during exposure. On the other hand, if the sensitivity is to be maintained without having to increase integration time upon reducing the size of the image sensor, the original pixel sizes must retained, which effectively reducing the number of pixels, and hence the resolution, in the reduced image sensor.

Figure 1A:
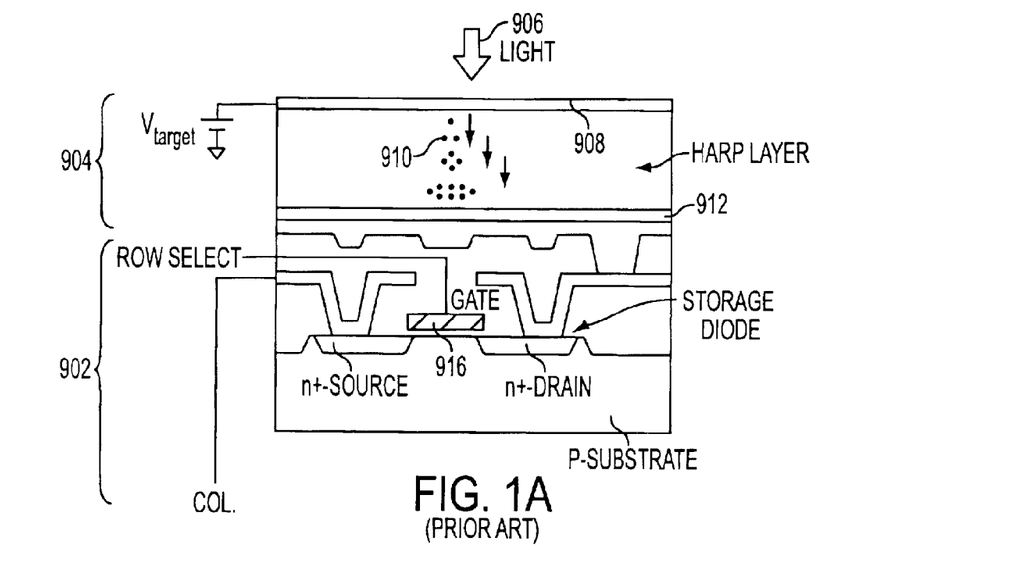
FIG. 1A is a cross-sectional view of a pixel in an image sensor having a charge multiplying photoconversion layer as known in the art.
Figure 1B:
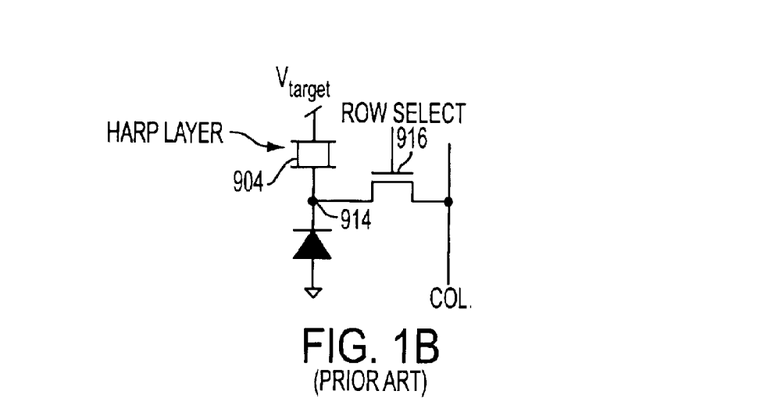
FIG. 1B is a circuit diagram of the pixel arrangement shown in FIG. 1A.

One solution towards achieving both a more compact size and high sensitivity is disclosed in "CMOS Image Sensor Overlaid with a HARP Photoconversion Layer," by T. Watabe, et al., published in the Program of the 1999 IEEE Workshop on Charge-Coupled Devices and Advanced Image Sensors, pp. 211–214. In this image sensor, which is shown in FIGS. 1A and 1B, the pixel circuit 902 is overlaid with a charge multiplying photoconversion layer, such as a high-gain avalanche rushing amorphous photoconductor ("HARP") photo-conversion layer 904 for amplifying the light signal produced by each pixel.

When a photon 906 hits the upper surface 908 of the HARP layer 904, a charge 910 in the form of holes is generated and amplified to many times its original level while being propelled through the HARP layer 904 to the bottom side 912. The pixel circuit 902 is electrically connected to the bottom side 912 of the HARP layer 904 such that the amplified light signal 910, upon reaching the bottom side 912 of HARP layer 904, is conducted into the pixel circuit 902 as electrical charge. The charge accumulates at a storage node 914 in the pixel circuit until the pixel data is read out by activating the gate of a row select switch 916. The amount of charge accumulated at the node 914, which is proportional to the intensity of light 906 detected, is read out. In this manner, the image sensor of FIGS. 1A and 1B allows each pixel to capture image data with an intensity and sensitivity equivalent to that attainable by significantly larger pixels that do not have the avalanche multiplication capability. As a result, use of a HARP layer enables the image quality to be improved without having to increase the size of the image sensor array.

In order to obtain avalanche multiplication in the HARP layer, an electric field of about $10^6$ V/cm is required, which is achieved by applying an operating voltage of between 50–100 V to the HARP layer. The multiplication factor of a HARP layer is dependent on the applied operating voltage, as described in "An a-Se HARP Layer for a Solid-state Image Sensor," by W-D. Park et al., IEEE Workshop on Charge-Coupled Devices and Advanced Image Sensors, pp. 56–59, June 1999, the teachings of which are hereby incorporated by reference.

In a typical HARP image sensor, voltages of less than about 8 V are used in the pixel circuit connected beneath the HARP layer, with the pixel circuit generally having a breakdown voltage of around 20 V. When the intensity of the incident light on the image sensor is at the upper end of the detection range for the charge multiplying photoconversion layer, the voltage level accumulating at the storage diode beneath the HARP layer approaches the level of the operating voltage applied to the HARP layer. As the voltage level at the storage node rises, however, the effective voltage applied across the photoconversion layer decreases, which affects the charge amplification function of the photoconversion layer. For example, in the arrangement shown in FIGS. 1A and 1B, as the charge representing a detected light flows from the HARP layer 904 and accumulates on the node 914 of the storage diode, the voltage at the node 914 increases, causing the potential difference between the operating voltage $V_{target}$ applied to the HARP layer 904 and the storage node 914 to decrease. The result is pixel signal saturation and a nonlinear response in which the signal levels recorded by the imaging device are not correctly represented in the pixel output.

To address this problem, it is necessary to find a way to amplify the intensity of light signals by the same amount under bright light conditions as for lower light conditions, by either accounting for the loss of effective operating voltage across the charge multiplying photoconversion layer or otherwise addressing the decreasing amplification in bright light conditions.

BRIEF SUMMARY OF THE INVENTION

The present invention mitigates the problem of pixel saturation and nonlinear amplification of the image signal output from a charge multiplying photoconversion layer by incorporating an output control circuit into the pixel circuit connected to the charge multiplying photoconversion layer. Preferably, the output control circuit is constructed as a charge trans-impedance amplifier (CTIA) circuit including at least an operational amplifier, wherein the CTIA serves to fix the voltage level at the storage node to thereby maintain a constant effective operating potential across the charge multiplying photoconversion layer.

In a first embodiment of the invention, the output control circuit maintains the effective voltage across a photoconversion element at a constant level and provides a linear output throughout the entire operating range of the photoconversion element. A second embodiment of the invention also fixes the voltage across the photoconversion element, and further logarithmically compresses the image signal obtained from the photoconversion element. The output control circuit of the third embodiment of the invention provides a linear output signal in low light conditions until the current from the photoconversion element reaches a predetermined threshold value, whereupon the output control circuit then switches the output to a logarithmic signal in brighter light conditions. Optionally, the output control circuit of this embodiment may be constructed so that the threshold value between the linear and logarithmic output characteristics is adjustable.

These and other features and advantages of the present invention will become more apparent from the following detailed description of the invention provided below with reference to the accompanying drawings.

DETAILED DESCRIPTION OF THE INVENTION

Figure 3:
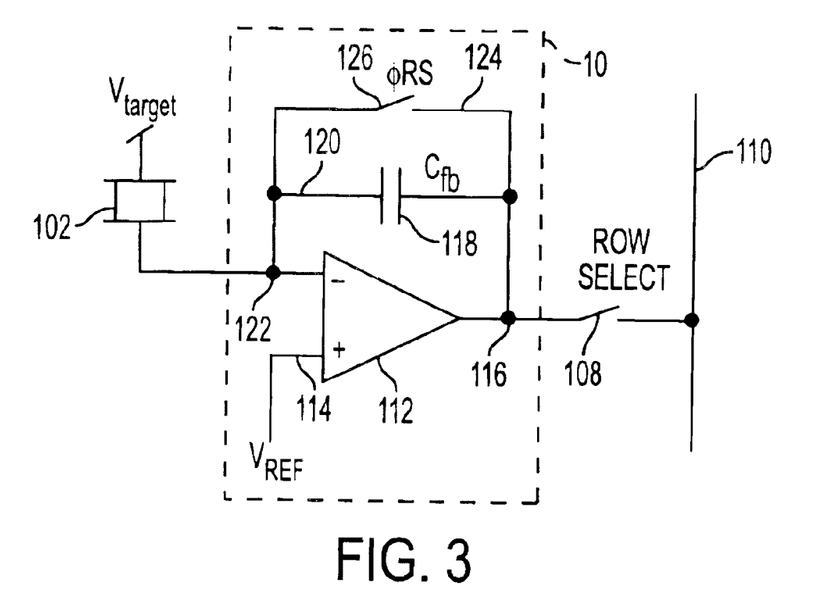
FIG. 3 is a circuit diagram of a first embodiment in accordance with the present invention.

A first embodiment of a pixel circuit in accordance with the present invention is shown in FIG. 3 and includes a charge multiplying photoconversion layer 102 connected to a voltage $V_{target}$ at its upper plate. An output control circuit 10 is connected to the bottom plate of charge multiplying photoconversion layer 102, for controlling the characteristics of the charge received from the charge multiplying photoconversion layer 102. A row select switch 108 is connected to the output side of the output control circuit 10 for reading out the accumulated charge representing the image signal acquired from the charge multiplying photoconversion layer 102. Preferably, row select switch 108 is formed as a MOS transistor and operated by a gate signal transmitted by a controller, such as the controller 824 shown in FIG. 9.

Figure 9:
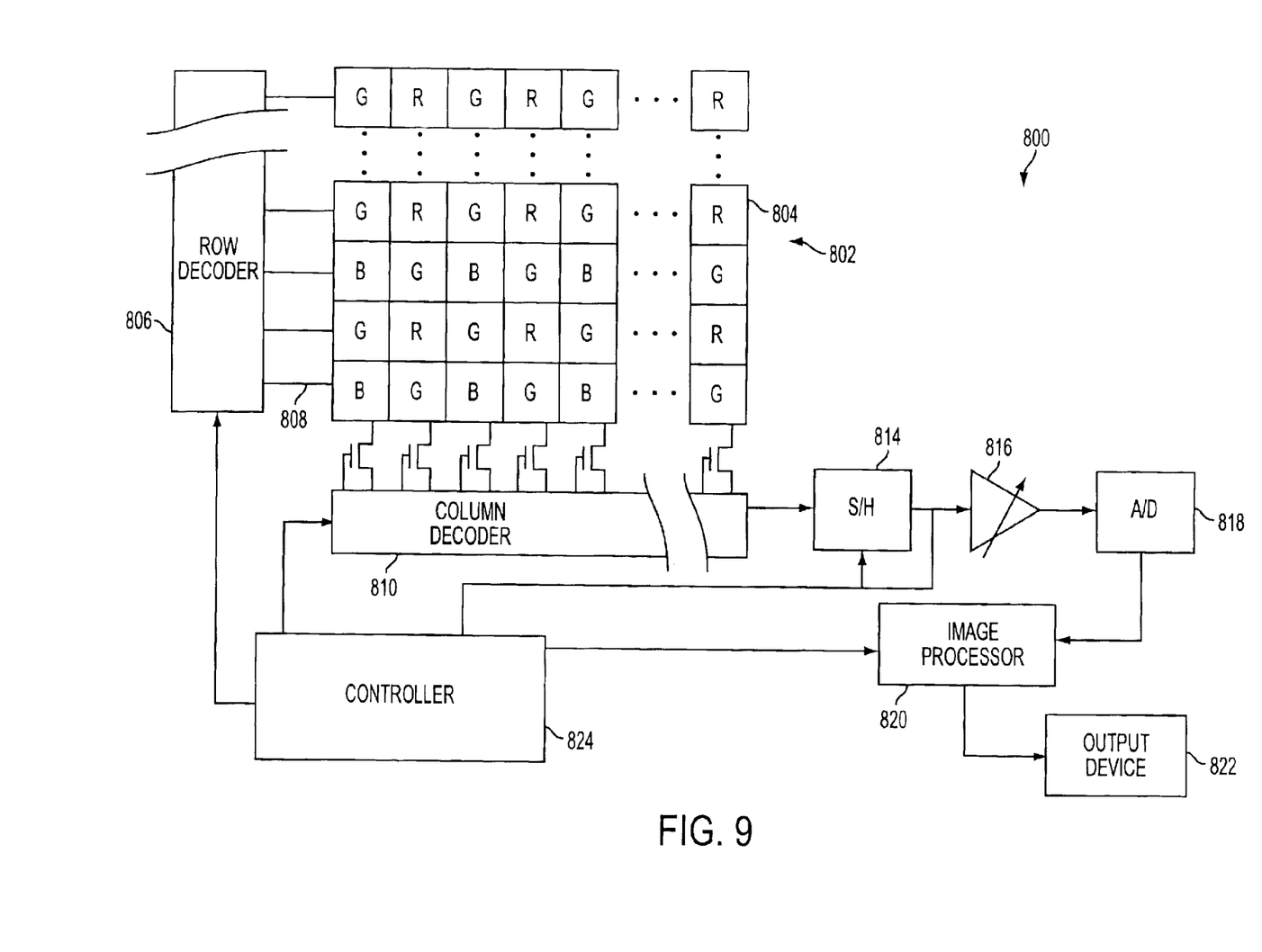
FIG. 9 is an example of an imaging apparatus incorporating the present invention.

Row select switch 108 is connected to column readout line 110 so that when the switch 108 is closed (for example, upon receiving a gate signal from a controller when the row select switch is a transistor), the output voltage of the output control circuit 10 is transferred to a column readout line 110 and from there to a sample and hold circuit (see, e.g., element 814 in FIG. 9). The image data from the pixel is transferred from the sample and hold circuit to a digitizer and then to an image processor where that charge is translated into image data along with the data read out from the other pixels in the image sensor array, to thereby construct the output image.

As seen in FIG. 3, the output control circuit 10 according to this embodiment is a charge trans-impedance amplifier (CTIA) circuit which includes a differential amplifier 112 connected to a constant voltage supply $V_{REF}$ at a positive input 114 thereof $V_{REF}$ is set to a value slightly below the operating voltage of the differential amplifier to obtain sufficient output voltage swing. A feedback loop 120 is formed between an output node 116 of the differential amplifier 112 and a negative input node 122 thereof, and a capacitor 118 is connected in the feedback loop 120. A reset switch 126 is connected in a second loop 124 formed between the negative input node 122 and the output node 116 of the differential amplifier 112 and parallel to the feedback loop 120, for shorting out the capacitor 118 at the initialization period preceding each integration time. Row select switch 108 is also connected to the output node 116 of the differential amplifier 112 downstream of the feedback loop 120 and second loop 124.

The differential amplifier 112 forces the voltage at the negative input node 122 to become fixed at $V_{REF}$, which in turn maintains the effective operating potential $V_{target}$ across the charge multiplying photoconversion layer 102 at a constant level, i.e., $V_{target}-V_{REF}$. Since the multiplication factor to which an image signal is amplified in the photoconversion layer 102 is a function of the applied bias to the photoconversion layer, fixing the potential at the at the output side of the photoconversion layer 102, which is at the same potential as the negative input node 122 to the differential amplifier 112, yields a constant multiplication factor of the image signals detected by the charge multiplying photoconversion layer 102.

During integration time in this pixel circuit, current from the photoconversion layer 102 is integrated on the capacitor 118. When the row select switch 108 is closed, the output voltage of the differential amplifier 112 is transferred to the column readout line 110. Configured in this manner, the output voltage from the differential amplifier 112 represents the intensity of the detected incident light on the photoconversion layer 102, and is given by Eq. 1 below:

$$V_{out} = V_{REF} - \frac{I_{HARP} \cdot t_{INT}}{C_{fb}} \qquad (1)$$

wherein $I_{HARP}$ and $t_{INT}$ represent the current from the charge multiplying photoconversion layer 102 and the integration time, respectively, and $C_{fb}$ represents the capacitance of the capacitor 118.

With the CTIA as shown in FIG. 3, the output control circuit 10 provides a linear output along the entire operating range of charge multiplying photoconversion layer 102.

Figure 4:
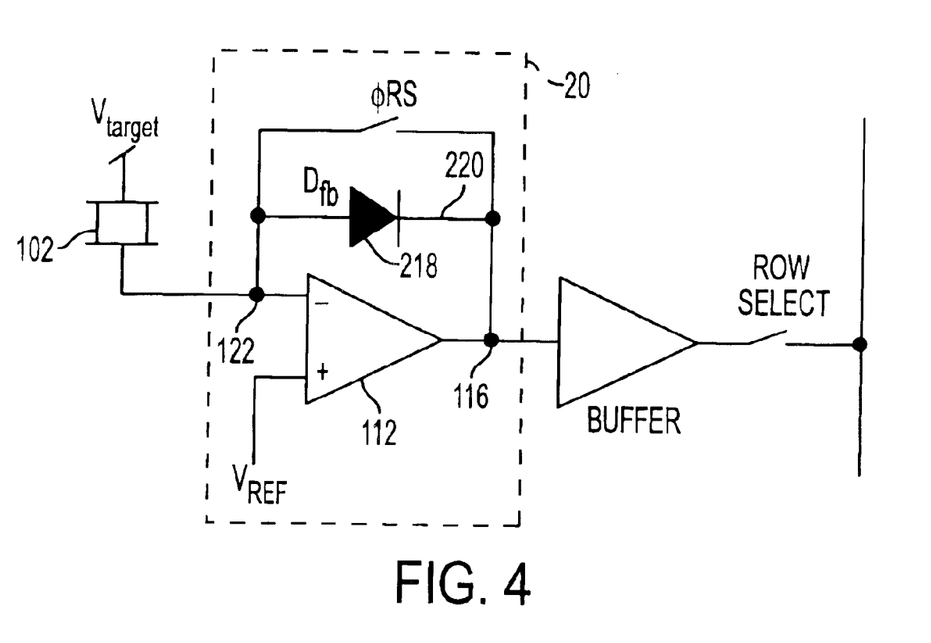
FIG. 4 is a circuit diagram of a second embodiment in accordance with the present invention.

FIG. 4 shows a pixel circuit in accordance with a second embodiment of the present invention. The second embodiment is generally the same as the pixel circuit discussed above with reference to FIG. 3, except that the output control circuit 10 in FIG. 3 is replaced by output control circuit 20 in the embodiment shown in FIG. 4. Components of this embodiment which are equivalent to those shown in FIG. 3 are identified in FIG. 4 with the same reference numerals, and description of those elements will be omitted in the description below.

Like output control circuit 10, output control circuit 20 also fixes the potential at the output side of a charge multiplying photoconversion layer 102 and the negative input node 122 to a differential amplifier 112, so as to maintain a constant effective input node voltage across the charge multiplying photoconversion layer 102 to be $V_{target}-V_{REF}$. Instead of a capacitor connected in the feedback loop, the CTIA circuit of output control circuit 20 includes a feedback diode 218 connected in a feedback loop 220 between the output node 116 and the negative input node 122 of the differential amplifier 112. The anode of the feedback diode 218 is connected to the negative input node 122 of the differential amplifier 112 while the cathode of the feedback diode 218 is connected to the output node 116 of the differential amplifier. The current flowing across the feedback diode 218 is determined according to Eq. 2 below:

$$I_{Dfb} = I_o \cdot \left\{ \exp\frac{q}{kT}(V_{REF} - V_{out}) - 1 \right\} = I_{HARP} \quad (2)$$

wherein $I_0$ is the saturation current of the feedback diode 218, q represents the charge of an electron ($=1.6 \cdot 10^{-19}$ coulombs (C)), k is Boltzmann's constant ($=1.38 \cdot 10^{-23}$ J/° K.), T represents the temperature of the diode measured in degrees Kelvin, $V_{out}$ is the output voltage from the differential amplifier 112, and $I_{HARP}$ represents the current from the charge multiplying photoconversion layer 102.

Using Eq. 2, the output voltage from the differential amplifier 112 can be determined as set forth in Eq. 3:

$$V_{out} = V_{REF} - \frac{kT}{q}\ln\frac{I_{HARP}}{I_o} \quad (3)$$

As can be seen from Eq. 3, the presence of feedback diode 218 in the feedback loop of the output control circuit 20 operates to logarithmically compress the current $I_{HARP}$ flowing from the charge multiplying photoconversion layer 102 through the differential amplifier 112. Although the image signal obtained from the pixel circuit shown in FIGS. 1A and 1B becomes compressed due to the decreasing effective voltage across the photoconversion layer as the detected light level increases, logarithmically compressing the image signal with the CTIA of the output control circuit 20 enables the pixel readout signal to be correlated much more predictably with the intensity of light actually detected at the photoconversion layer.

Figure 5:
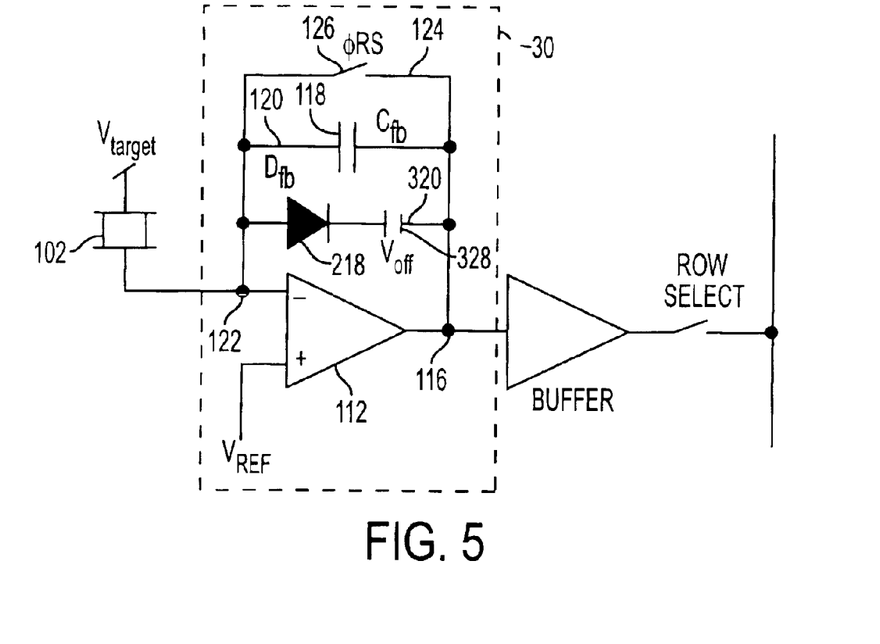
FIG. 5 is a circuit diagram of a third embodiment in accordance with the present invention.

A third embodiment of the present invention is shown in FIG. 5 and includes an output control circuit 30 in place of the output control circuits 10 and 20 in the embodiments described previously. Components shown in FIG. 5 that are equivalent to the components shown in FIGS. 3 and 4 are identified with the same reference numerals, and discussion of those components will be omitted in the description of this embodiment below. Output control circuit 30 is constructed as a CTIA which includes a first feedback loop 120 and a second feedback loop 320 both connected between the output node 116 and the negative input node 122 of a differential amplifier 112.

Feedback loop 120 includes a capacitor 118 for providing a linear output from the differential amplifier 112, similarly to the embodiment of FIG. 3. Feedback loop 320 is arranged in parallel to feedback loop 120 and includes a feedback diode 218 and an offset voltage source 328 that applies a voltage $V_{off}$ to the cathode of feedback diode 218. Offset voltage source 328 is connected to the output node 116 of a differential amplifier 112 and to the cathode of feedback diode 218, while the anode of feedback diode is connected to the negative input node 122 of the differential amplifier 112. A third loop 124 contains a reset switch 126 and is also connected between the output node 116 and the negative input node 122 of differential amplifier 112, in parallel to feedback loops 120 and 320.

The current $I_{HARP}$ from the photoconversion layer 102 flows through the CTIA of output control circuit 30 according to Eq. 4 as follows:

$$I_o \cdot \exp\left\{\frac{q}{kT}(V_{REF} - V_{out} - V_{off})\right\} + \frac{d}{dt}C_{fb}(V_{REF} - V_{out}) = I_{HARP} \quad (4)$$

The first term represents the current flowing across the feedback diode 218 and the second term represents the current flowing to the feedback capacitor 118. When $V_{REF} - V_{out} - V_{off} < 0$, that is, when $V_{REF} - V_{off} < V_{out} < V_{REF}$, the second term of Eq. 4 is dominant. In this situation, no current flows through the feedback diode 218, and the output voltage $V_{out}$ from the output control circuit 30 is determined according to Eq. 1 set forth above.

On the other hand, when $V_{REF} - V_{out} - V_{off} > 0$, that is, when $V_{out} < V_{REF} - V_{off}$, current flows through the feedback diode 218 and becomes logarithmically compressed, as indicated by the first term in Eq. 4. When $I_{HARP}$ is sufficiently large, the second term becomes negligible, which yields an output voltage of the differential amplifier 112 according to Eq. 5 below:

$$V_{out} = V_{REF} - V_{off} - \frac{kT}{q}\ln\frac{I_{HARP}}{I_o} \quad (5)$$

Figure 6:
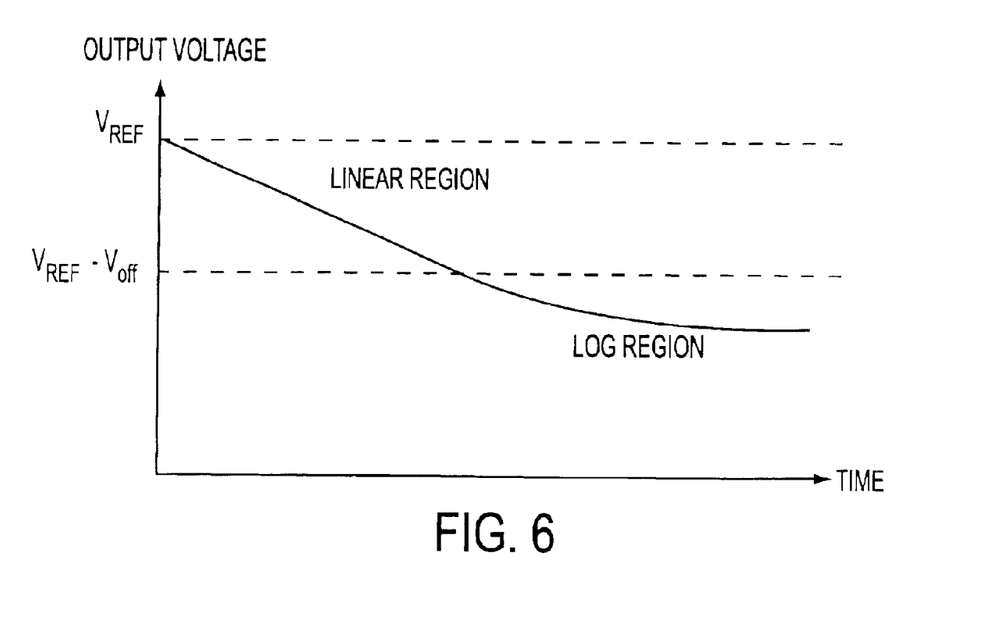
FIG. 6 is a graph for illustrating the conversion characteristics obtained by the embodiment shown in FIG. 5.

The resulting conversion characteristics represented by $V_{out}$ over time is shown in FIG. 6, where it can be clearly seen that linear conversion characteristics are obtained when $V_{out} > V_{REF} - V_{off}$, and logarithmic conversion characteristics are obtained when $V_{out} < V_{REF} - V_{off}$. Thus, the readout signal obtained from the pixel circuit shown in FIG. 5 varies linearly with the signal outputted from the charge multiplying photoconversion layer 102 in low light conditions, and varies logarithmically with the signal outputted from the charge multiplying photoconversion layer 102 in bright light conditions.

Optionally, the transition point at which the output control circuit 30 switches from the linear conversion mode to the logarithmic conversion mode can be made to be adjustable by enabling a user to apply a variable reverse bias potential to the feedback diode 218. This variation of the pixel circuit of FIG. 5 is illustrated in FIG. 7 and discussed below as the fourth embodiment of the present invention.

Figure 7:
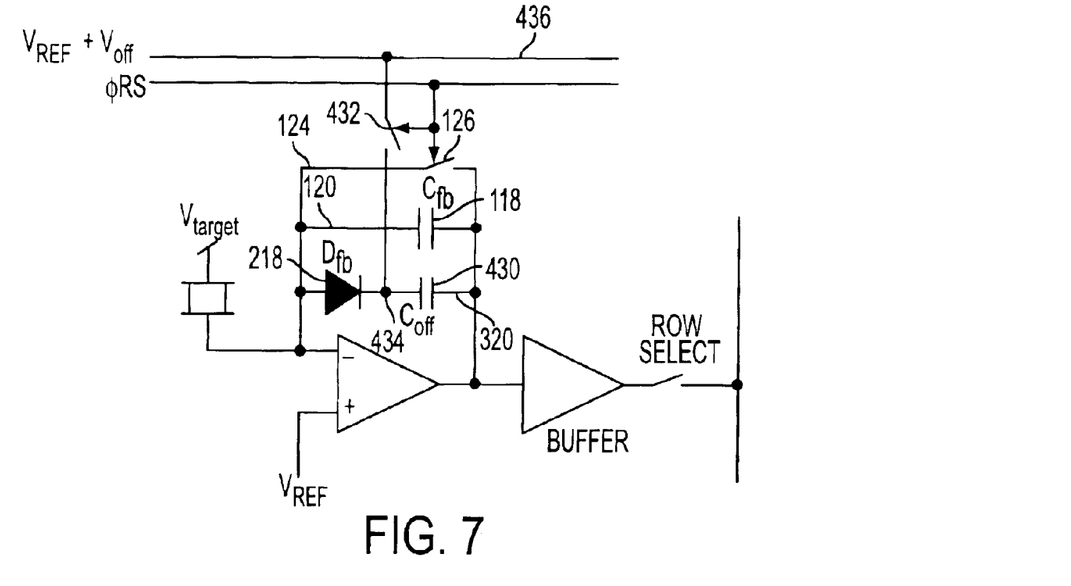
FIG. 7 is a circuit diagram of a fourth embodiment in accordance with the present invention.

The pixel circuit shown in FIG. 7 is nearly identical to that shown in FIG. 5, except that the offset voltage source 328 in FIG. 5 is replaced with an offset capacitor 430. Again, components in FIG. 7 that are equivalent to those shown in the previous drawings are identified with the same reference numerals, and descriptions of those elements will be omitted in the explanation of this embodiment provided below.

One terminal of a switch 432 is connected to the offset capacitor 430 at a node 434 located along a feedback loop 320 between the capacitor 430 and a feedback diode 218. The other terminal of the switch 432 is connected to a voltage source 436 having a voltage $V_{REF} + V_{off}$. The voltage level of $V_{off}$ may be adjustable by a user to thereby adjust the transition point between the linear and logarithmic operation modes of the pixel circuit. The adjustable voltage $V_{off}$ is applied to the feedback diode 218 by closing the switch 432 which enables current from the voltage source 436 at the selected voltage level to flow to the capacitor 430. Even if the level of $V_{off}$ is not adjusted, the voltage level applied to the cathode of feedback diode 218 can be adjusted by controlling the length of time that the switch 432 is closed, which controls the amount of charge in, and hence the voltage across the feedback capacitor 430.

During the initialization period before the start of each integration time and before charging the offset capacitor 430, the switch 432 is closed along with reset switch 126 by a reset signal ΦRS. When the switches 126 and 432 are closed by the reset signal ΦRS, the capacitor 118 is shorted out to clear out any residual charge on the capacitors associated with the image signal most recently read out from the pixel circuit and the capacitor 430 is charged to $V_{off}$.

Figure 8:
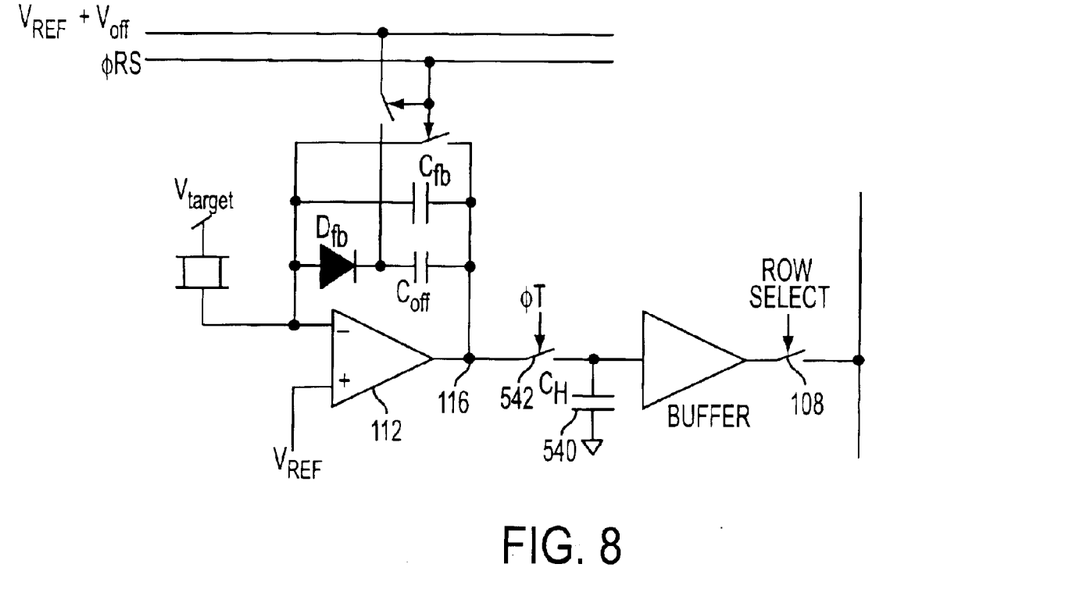
FIG. 8 is a circuit diagram in accordance with a fifth embodiment of the present invention.

A fifth embodiment of the present invention is shown in FIG. 8, and is identical to the embodiment shown in FIG. 7, except that the embodiment shown in FIG. 8 further includes a circuit for performing a freeze frame shutter operation. Specifically, a freeze frame switch 542 and a hold capacitor 540 are connected in the pixel circuit between the output node 116 from the differential amplifier 112 and the row select switch 108. Freeze frame switch 542 is controlled by a transfer signal ΦT that closes the freeze frame switch 542 to enable the image signal to flow to and be stored in the hold capacitor 540. When the freeze frame switch is opened, no further charge can accumulate in the hold capacitor 540.

After charging the hold capacitor 540 with the image signal, the charge is held in the hold capacitor to enable the image signal for that pixel to be read out by closing the row select switch 108 for each readout operation. For example, when an image is captured by an entire image sensor pixel array, the image sensor can be operated in freeze frame mode in which the image signal for each pixel is frozen so that the image data from all the pixels in the array can be read out row by row. Thus, the freeze frame switch 542 is closed and then opened by operation of the transfer signal ΦT to all of the pixels in the image sensor array at the same time, whereupon the row select signal is applied to the image sensor array row by row to read out the pixel image signals.

In the embodiments shown in FIGS. 4, 5, 7 and 8 described above, feedback diode 218 may be implemented by use of the sub-threshold characteristics of a MOS transistor. It is readily understood by one of ordinary skill in the art that a MOS transistor has four operational modes depending on bias conditions: 1) when no bias is applied to the gate, the transistor is off and no current flows from the drain; 2) the transistor is in a subthreshold region when the gate voltage $V_G$ is less than a predetermined threshold voltage $V_T$, wherein the current flowing from the drain is $I_D = I_0 \cdot \exp\{q(V_G - V_T)/kT\}$; 3) the transistor is in a saturation region when $V_G - V_T < V_D$ (drain voltage), wherein the current flowing from the drain is $I_D = (\beta/2) \cdot (V_G - V_T)^2$; and 4) the transistor is in a linear region when $V_G - V_T > V_D$, wherein the current flowing from the drain is $I_D = \beta \cdot (V_G - V_T - V_D/2) \cdot V_D$.

Figure 2:
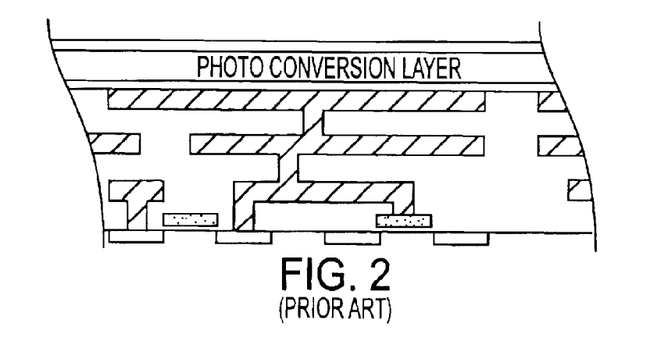
FIG. 2 is an illustration of an alternative photoconversion element usable with the present invention.

In each of the embodiments described above, the charge multiplying photoconversion layer is preferably a high-gain avalanche rushing amorphous photo conductor (HARP) photoconversion layer. Alternatively, however, other photosensitive elements for detecting and performing photoconversion of a light signal and subsequently or simultaneously amplifying the resulting electrical charge may be used instead, such as a photodiode or a stacked pixel sensor structure, wherein the effective light sensitive area may be significantly increased by the stacked structure. An example of a stacked pixel sensor structure is illustrated in FIG. 2 and described in fuller detail in "A Stacked CMOS APS For Charge Particle Detection And Its Noise Performance," by I. Takayanagi et al., IEEE Workshop on Charge-Coupled Devices and Advanced Image Sensors, pp. 159–162, June 1999, the contents of which are hereby incorporated by reference.

An example of an imaging device incorporating the present invention is shown in FIG. 9. Specifically, an imaging apparatus 800 includes an image sensor 802 having a pixel array arranged according to a Bayer filter pattern. A charge multiplying photoconversion layer such as a HARP layer is provided over each of the pixels in the array under the filter pattern. Each pixel 804 contains the protection and readout circuits in accordance with any one of the various embodiments discussed herein above.

The imaging apparatus 800 further includes a row decoder 806 includes a plurality of row select activation lines 808 corresponding in number to the number of rows in the pixel array of the image sensor 802, wherein each line is connected to each row select switch in all the pixels in a respective row of the array. Similarly, column decoder 812 includes a plurality of column lines 812, the number of which corresponds to the number of columns in the pixel array of the image sensor 802. Each column line 812 is connected to the output sides of the row select switches in all the pixels in a respective column.

To read the image data obtained by the image sensor 802, controller 824 controls the row decoder 806 to sequentially activate the row select lines, whereby the row select switches for each pixel in a selected row is activated to thereby dump the image data from each respective pixel to the respective column line. Since each pixel in a row is connected to a different column line, the image data for each pixel is then read out to the image processor by sequentially activating all the column lines through column decoder 810. Thus, after activation of each row select line, the column lines are sequentially activated to collect the image data in an orderly manner across the array:

Upon reading the image data out of the pixel array, the data is passed through a number of processing circuits which, in linear order, generally include a sample and hold circuit 814, an amplifier 816, an analog to digital converter 818, an image processor 820, and an output device 822.

Without being limiting, such the imaging apparatus 800 could be part of a computer system, camera system, scanner, machine vision system, vehicle navigation system, video telephone, surveillance system, auto focus system, star tracker system, motion detection system, image stabilization system and other systems requiring an imager.

Figure 10:
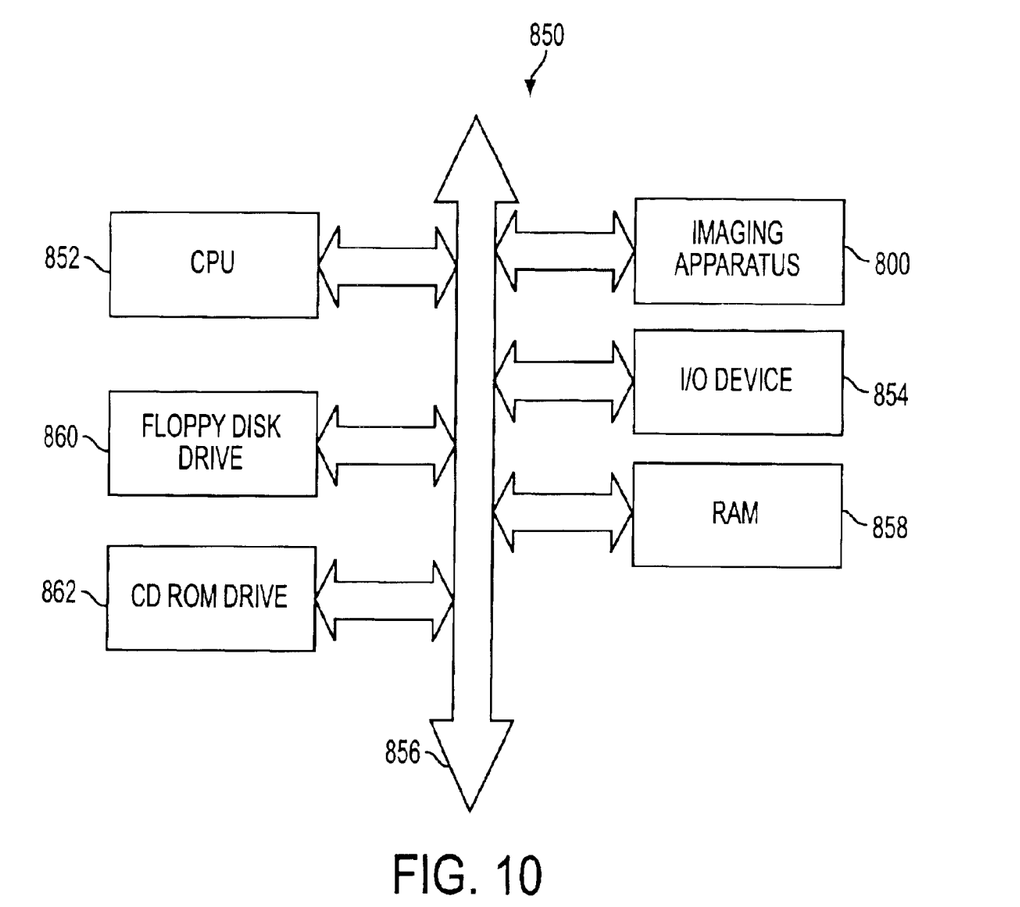
FIG. 10 is an illustration of a processing system communicating with the imaging apparatus of the present invention.

The imaging apparatus 800 may also be connected to a processor system 850, as shown in FIG. 10, such as a computer system. A processor system 850 generally comprises a central processing unit (CPU) 852 that communicates with an input/output (I/O) device 854 over a bus 856. The imaging apparatus 800 communicates with the system over bus 856 or a ported connection. The processor system 800 also includes random access memory (RAM) 858, and, in the case of a computer system, may include peripheral devices such as a floppy disk drive 860 and a compact disc (CD) ROM drive 862 which also communicate with CPU 852 over the bus 856.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed as new and desired to be protected by Letters Patent of the United States is:

1. A light sensing pixel comprising:
   a photosensitive element having an input side for detecting a light signal and an output side for outputting the detected light signal as an electrical image signal; and
   an output control circuit connected to the output side of the photosensitive element, wherein the output control circuit fixes the potential of the output side of the photosensitive element at a predetermined voltage level.

2. The pixel according to claim 1, wherein the photosensitive element is a photodiode.

3. The pixel according to claim 1, wherein the photosensitive element is a stacked pixel structure.

4. The pixel according to claim 1, wherein the photosensitive element is a charge multiplying photoconversion layer.

5. The pixel according to claim 1, wherein the photosensitive element is a high gain avalanche rushing amorphous photoconductor photoconversion layer.

6. The pixel according to claim 1, wherein the output control circuit comprises an operational amplifier and a feedback loop.

7. The pixel according to claim 6, wherein the operational amplifier is a differential amplifier having a first input, a second input and an output.

8. The pixel according to claim 7, wherein the first input is connected to a fixed voltage $V_{REF}$.

9. The pixel according to claim 7, wherein the second input is connected to the output of the differential amplifier via the feedback loop.

10. The pixel according to claim 7, wherein the first input is a positive input and is connected to a fixed voltage $V_{REF}$, and the second input is a negative input and is connected to the output of the differential amplifier via the feedback loop.

11. The pixel according to claim 1, wherein the output control circuit provides a linear amplification of the image signal outputted from the photosensitive element.

12. The pixel according to claim 11, wherein the output control circuit comprises:

a differential amplifier having a fixed voltage $V_{REF}$ connected to a first input to the differential amplifier, a feedback loop connecting a second input of the differential amplifier to the output thereof, and a capacitor connected in the feedback loop.

13. The pixel according to claim 12, wherein the first input is a positive input to the differential amplifier and the second input is a negative input to the differential amplifier.

14. The pixel according to claim 12, wherein the output control circuit further comprises a second loop connected between the output of the differential amplifier and the second input thereto, in parallel with the feedback loop, wherein the second loop includes a reset switch connected therein.

15. The pixel according to claim 1, wherein the output control circuit provides a logarithmically compressed conversion of the image signal outputted from the photosensitive element.

16. The pixel according to claim 15, wherein the output control circuit comprises:

a differential amplifier having a fixed voltage $V_{REF}$ connected to a first input to the differential amplifier, a feedback loop connecting a second input of the differential amplifier to the output thereof, and a diode connected in the feedback loop with the anode of the diode connected to the negative input to the differential amplifier and the cathode of the diode connected to the output of the differential amplifier.

17. The pixel according to claim 16, wherein the first input is a positive input to the differential amplifier and the second input is a negative input to the differential amplifier.

18. The pixel according to claim 16, wherein the diode is formed as a MOS transistor.

19. The pixel according to claim 16, wherein the output control circuit further comprises a second loop connected between the output of the differential amplifier and the second input thereto, in parallel with the feedback loop, wherein the second loop includes a reset switch connected therein.

20. The pixel according to claim 1, wherein the output control circuit provides a linear conversion when the image signal outputted from the photosensitive element is within a first signal range and a logarithmically compressed conversion when the image signal is within a second signal range.

21. The pixel according to claim 20, wherein the output control circuit comprises:

a differential amplifier having a fixed voltage $V_{REF}$ connected to a first input to the differential amplifier, a first feedback loop connecting a second input of the differential amplifier to the output thereof, a feedback capacitor connected in the first feedback loop, a second feedback loop connecting the second input of the differential amplifier to the output thereof, in parallel with the first feedback loop, a diode connected in the second feedback loop with the anode of the diode connected to the second input to the differential amplifier, and a reverse bias voltage connected to the cathode of the diode in the second feedback loop.

22. The pixel according to claim 21, wherein the first input is a positive input to the differential amplifier and the second input is a negative input to the differential amplifier.

23. The pixel according to claim 21, further comprising an offset voltage source connected in the second feedback loop and to the cathode of the diode for applying the reverse bias voltage to the diode.

24. The pixel according to claim 21, further comprising an offset capacitor connected in the second feedback loop and to the cathode of the diode, and an offset switch having a first terminal connected to the second feedback loop between the cathode of the diode and the offset capacitor, and having a second terminal connected to an offset voltage source, whereby the offset capacitor becomes charged upon closing the offset switch to thereby apply the reverse bias voltage to the diode.

25. The pixel according to claim 21, wherein the diode is formed as a MOS transistor.

26. The pixel according to claim 21, wherein the output control circuit further comprises a third loop connected between the output of the differential amplifier and the negative input thereto, in parallel with the first and second feedback loops, wherein the third loop includes a reset switch connected therein.

27. The pixel according to claim 1, further comprising a freeze frame circuit connected to the output of the output control circuit for performing a freeze frame shutter function.

28. The pixel according to claim 27, wherein the freeze frame circuit comprises:

a freeze frame switch having one terminal thereof connected to the output control circuit, and a capacitor connected to the other terminal of the freeze frame switch, for capturing the charge of an image signal processed by the output control circuit when the freeze frame switch is closed.

29. The pixel according to claim 1, further comprising a row select switch connected downstream from the output control circuit, for reading out the image signal after being processed by the output control circuit.

30. The pixel according to claim 29, wherein the row select switch is a transistor.

31. A light sensing pixel comprising:
 a charge multiplying photoconversion layer having an input side for detecting a light signal and an output side for outputting the detected light signal as an electrical image signal; and
 an output control circuit connected to the output side of the charge multiplying photoconversion layer, wherein the output control circuit maintains the potential across the charge multiplying photoconversion layer to be at a predetermined voltage level.

32. A light sensing pixel comprising:
 a charge multiplying photoconversion layer having an input side for detecting a light signal and an output side for outputting the detected light signal as an electrical image signal; and
 an output control circuit connected to the output side of the photosensitive element, wherein the output control circuit provides a linear conversion of the image signal outputted from the charge multiplying photoconversion layer for the entire operational range of the charge multiplying photoconversion layer.

33. A light sensing pixel comprising:
 a charge multiplying photoconversion layer having an input side for detecting a light signal and an output side for outputting the detected light signal as an electrical image signal; and
 an output control circuit connected to the output side of the photosensitive element, wherein the output control circuit provides a logarithmically compressed conversion of the image signal outputted from the photosensitive element for the entire operational range of the charge multiplying photoconversion layer.

34. A light sensing pixel comprising:
 a charge multiplying photoconversion layer having an input side for detecting a light signal and an output side for outputting the detected light signal as an electrical image signal; and
 an output control circuit connected to the output side of the photosensitive element, wherein the output control circuit provides a linear conversion of the image signal outputted from the photosensitive element when the output of the photosensitive element is within a first range and a logarithmically compressed conversion of the image signal when the output of the photosensitive element is within a second range.

35. A method for obtaining an image signal, comprising:
 detecting a light signal with an imaging pixel;
 photoconverting the light signal into an electrical image signal with a charge multiplying photosensitive element of the imaging pixel; and
 fixing the potential of the output of the photosensitive element at a predetermined voltage level.

36. The method according to claim 35, further comprising performing a linear conversion of the image signal outputted from the photosensitive element over the entire operating range of the photosensitive element.

37. The method according to claim 35, further comprising logarithmically compressing the image signal outputted from the photosensitive element over the entire operating range of the photosensitive element.

38. The method according to claim 35, further comprising performing a linear conversion of the image signal outputted from the photosensitive element when the outputted image signal is within a first range up to a predetermined threshold level, and logarithmically compressing the image signal when the outputted image signal is within a second range above the threshold level.

39. The method according to claim 38, further comprising adjusting the threshold level at which the output control circuit switches from performing linear conversion of the image signal to logarithmic compression of the image signal.

40. The method according to claim 35, further comprising performing a freeze frame operation on the image signal obtained by the charge multiplying photosensitive element.

41. A method for obtaining an image signal, comprising:
 photoconverting a light signal into an electrical image signal with a charge multiplying photoconversion layer;
 amplifying the electrical image signal in the charge multiplying photoconversion layer; and
 maintaining the potential across the charge multiplying photoconversion layer to be constant at a predetermined voltage level.

42. The method according to claim 41, further comprising performing a linear conversion of the image signal outputted from the charge multiplying photoconversion layer over the entire operating range of the charge multiplying photoconversion layer.

43. The method according to claim 41, further comprising logarithmically compressing the image signal outputted the charge multiplying photoconversion layer over the entire operating range of the charge multiplying photoconversion layer.

44. The method according to claim 41, further comprising performing a linear conversion of the image signal outputted from the charge multiplying photoconversion layer when the outputted image signal is within a first range up to a predetermined threshold level and logarithmically compressing the image when the outputted image signal is within a second range above the threshold level.

45. The method according to claim 44, further comprising adjusting the threshold level at which the output control circuit switches from performing linear conversion of the image signal to logarithmic compression of the image signal.

46. The method according to claim 41, further comprising performing a freeze frame operation on the image signal obtained by the charge multiplying photosensitive element.

47. An image processing apparatus comprising:
 an image sensor for detecting an image and outputting image signals corresponding to the detected image; and
 an image processor for processing the image signals outputted from the image sensor,
 wherein the image sensor comprises a pixel array having a plurality of pixels, wherein each pixel comprises:
  a photosensitive element having an input side for detecting a light signal and an output side for outputting the detected light signal as an electrical image signal; and
  an output control circuit connected to the output side of the photosensitive element, wherein the output control circuit fixes the potential of the output side of the photosensitive element at a predetermined voltage level.

48. A processing system, comprising:
 a processor for receiving and processing image data; and
 an image data generator for supplying image data to the processor, the image data generator comprising:

an image sensor for obtaining an image and outputting an image signal, an image processor for processing the image signal, and a controller for controlling the image sensor and the image processor, wherein the image sensor comprises a pixel array having a plurality of pixels, wherein each pixel comprises:

a photosensitive element having an input side for detecting a light signal and an output side for outputting the detected light signal as an electrical image signal; and an output control circuit connected to the output side of the photosensitive element, wherein the output control circuit fixes the potential of the output side of the photosensitive element at a predetermined voltage level.

* * * * *

UNITED STATES PATENT AND TRADEMARK OFFICE
CERTIFICATE OF CORRECTION

PATENT NO. : 6,821,808 B2
DATED : November 23, 2004
INVENTOR(S) : Junichi Nakamura et al.

It is certified that error appears in the above-identified patent and that said Letters Patent is hereby corrected as shown below:

Column 1,
Line 35, "reducing" should read -- reduces --.

Column 4,
Line 3, "thereof $V_{REF}$" should read -- thereof. $V_{REF}$ --.

Column 6,
Line 11, "$V_{RFF}$-" should read -- $V_{REF}$- --.

Column 8,
Line 9, "806 includes" should read -- 806 and includes --.
Line 22, "switches" should read -- switch --.

Column 12,
Line 29, "outputted the" should read -- outputted from the --.

Signed and Sealed this

Ninth Day of August, 2005

JON W. DUDAS
*Director of the United States Patent and Trademark Office*